(12) United States Patent
Peters et al.

(10) Patent No.: US 12,271,108 B2
(45) Date of Patent: Apr. 8, 2025

(54) APPARATUS FOR POSITIONING AND CLAMPED CURING

(71) Applicant: ASML NETHERLANDS B.V., Veldhoven (NL)

(72) Inventors: Martin Dieter Nico Peters, Vught (NL); Marcellus Antonius De Folter, Son en Breugel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 781 days.

(21) Appl. No.: 17/256,048

(22) PCT Filed: Jun. 3, 2019

(86) PCT No.: PCT/EP2019/064326
§ 371 (c)(1),
(2) Date: Dec. 24, 2020

(87) PCT Pub. No.: WO2020/007546
PCT Pub. Date: Jan. 9, 2020

(65) Prior Publication Data
US 2021/0271159 A1 Sep. 2, 2021

(30) Foreign Application Priority Data

Jul. 4, 2018 (EP) .................................... 18181606
Nov. 23, 2018 (EP) .................................... 18208040
(Continued)

(51) Int. Cl.
*B65G 47/92* (2006.01)
*G03B 1/00* (2021.01)
(Continued)

(52) U.S. Cl.
CPC ............... *G03F 1/64* (2013.01); *B65G 47/92* (2013.01); *G03B 27/52* (2013.01); *G03B 27/58* (2013.01); *G03F 1/66* (2013.01)

(58) Field of Classification Search
CPC ....... B25J 15/0246; B65G 47/90; B65G 47/92
(Continued)

(56) References Cited

U.S. PATENT DOCUMENTS 5,042,655 A     8/1991   Beldyk et al.
5,375,898 A * 12/1994   Ohmori ................... B65B 43/54
                                                          294/27.1
(Continued)

FOREIGN PATENT DOCUMENTS

CN    201389856    1/2010
CN    204203267    3/2015
(Continued)

OTHER PUBLICATIONS

International Search Report and Written Opinion issued in corresponding PCT Patent Application No. PCT/EP2019/064326, dated Oct. 14, 2019.
(Continued)

*Primary Examiner* — Dean J Kramer
(74) *Attorney, Agent, or Firm* — Pillsbury Winthrop Shaw Pittman, LLP

(57) ABSTRACT

An apparatus including: a first gripping member having a first magnetic element and moveable between a first position and a second position; a first biasing member configured to bias the first gripping member toward the first position; and a second magnetic element selectively operable in a first mode, in which the second magnetic element interacts with the first magnetic element to overcome the first biasing member and move the first gripping member to the second position, and a second mode, in which the second magnetic (Continued)

element does not overcome the first biasing member such that the first gripping member rests in the first position.

20 Claims, 10 Drawing Sheets

(30) Foreign Application Priority Data

Dec. 20, 2018 (EP) ..................................... 18214483
Jan. 25, 2019 (EP) ..................................... 19153678

(51) Int. Cl.
    *G03B 27/52* (2006.01)
    *G03B 27/58* (2006.01)
    *G03F 1/64* (2012.01)
    *G03F 1/66* (2012.01)

(58) Field of Classification Search
    USPC ........................................ 294/192, 196, 207
    See application file for complete search history.

(56) References Cited

U.S. PATENT DOCUMENTS

| | | | |
|---|---|---|---|
| 5,669,652 A * | 9/1997 | Reising | B65G 47/90 |
| | | | 294/195 |
| 6,626,476 B1 * | 9/2003 | Govzman | B25J 15/0273 |
| | | | 294/192 |
| 7,784,603 B2 | 8/2010 | Burgmeier | |
| 2005/0045262 A1 | 3/2005 | Eschbach et al. | |
| 2009/0020394 A1 | 1/2009 | Burgmeier | |
| 2011/0215602 A1 | 9/2011 | Shirasaki | |
| 2014/0253898 A1 | 9/2014 | Lee-Chih et al. | |
| 2015/0131071 A1 | 5/2015 | Kim et al. | |
| 2017/0052460 A1 | 2/2017 | Yoneda et al. | |

FOREIGN PATENT DOCUMENTS

| | | | | |
|---|---|---|---|---|
| CN | 105773573 | | 7/2016 | |
| CN | 205708567 | | 11/2016 | |
| CN | 205763548 | | 12/2016 | |
| CN | 205794135 | | 12/2016 | |
| CN | 106514686 | | 3/2017 | |
| CN | 106927251 | | 7/2017 | |
| CN | 107511781 | | 12/2017 | |
| DE | 102011117622 A1 * | 5/2013 | ........... B65G 47/848 |
| EP | 1661670 A1 * | 5/2006 | ........... B25B 11/002 |
| GB | 2344220 | | 5/2000 | |
| JP | H01-097582 | | 4/1989 | |
| JP | H0311346 | | 1/1991 | |
| JP | H07142562 | | 6/1995 | |
| JP | H07248614 | | 9/1995 | |
| JP | 2007333950 | | 12/2007 | |
| JP | 2012103638 | | 5/2012 | |
| JP | 2013145328 | | 7/2013 | |
| JP | 2014525074 | | 9/2014 | |
| JP | 2015176932 | | 10/2015 | |
| KR | 101317206 | | 10/2013 | |
| WO | 2016079052 | | 5/2016 | |
| WO | 2016124536 A2 | | 8/2016 | |
| WO | 2016124536 A3 | | 8/2016 | |

OTHER PUBLICATIONS

Netherlands Search Report issued in corresponding Netherlands Patent Application No. 2025658, dated Dec. 14, 2020.
Wang, H. et al.: "An Update on Pellicle-Compatible EUV Inner Pod Development", Proc. of SPIE, vol. 9776, Mar. 18, 2016.
Office Action issued in corresponding Japanese Patent Application No. 2020-571832, dated Apr. 25, 2023.
Office Action issued in corresponding Korean Patent Application No. 10-2020-7038123, dated Aug. 27, 2024.
Office Action issued in corresponding Chinese Patent Application No. 201980045076.7, dated Oct. 29, 2024.
Office Action issued in corresponding Japanese Patent Application No. 2023-184161, dated Jan. 29, 2025.
Office Action issued in corresponding Chinese Patent Application No. 201980045076, dated Jan. 21, 2025.

* cited by examiner

APPARATUS FOR POSITIONING AND CLAMPED CURING

CROSS-REFERENCE TO RELATED APPLICATIONS

This application is the U.S. national phase entry of PCT Patent Application No. PCT/EP2019/064326, which was filed Sep. 1, 2020, which is based upon and claims priority of European Patent Application No. 18181606.7, which was filed on Jul. 4, 2018; European Patent Application No. 18208040.8, which was filed on Nov. 23, 2018; European Patent Application No. 18214483.2, which was filed on Dec. 20, 2018, and European Patent Application No. 19153678.8, which was filed on Jan. 25, 2019, each of which are all incorporated herein in its entirety by reference.

FIELD

The present invention relates to an apparatus for positioning and clamped curing. In particular, the apparatus may be used in connection with a pellicle assembly tool.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

A patterning device (e.g., a mask) that is used to impart a pattern to a radiation beam in a lithographic apparatus may form part of a mask assembly. A mask assembly may include a pellicle that protects the patterning device from particle contamination. The pellicle may be supported by a pellicle frame. The pellicle and pellicle frame may be attached to form a pellicle assembly. Apparatus for manufacturing pellicle assemblies are described in international patent application WO 2016/079052 A2. Apparatus for manufacturing pellicle assemblies may comprise a gripping apparatus.

It may be desirable to provide a gripping apparatus that obviates or mitigates one or more problems associated with the prior art.

SUMMARY

According to a first aspect, there is provided an apparatus comprising: a first gripping member comprising a first magnetic element and moveable between a first position and a second position; a first biasing member configured to bias the first gripping member toward the first position; and a second magnetic element selectively operable in a first mode, in which the second magnetic element interacts with the first magnetic element to overcome the first biasing member and move the first gripping member to the second position, and a second mode, in which the second magnetic element does not overcome the first biasing member, such that the first gripping member rests in the first position.

In this way, the first gripping member can be used to selectively grip an object. For example, the first gripping member may not interact with the object in the first position and may act to grip the object in the second position. By operating the second magnetic element in the first mode, the biasing force exerted by the first biasing member that acts to hold the first gripping member in the first position may be overcome, so that the first gripping member is moved from the first position to the second position. In the second position, for example, the first gripping member may exert a force on the object in order to grip the object between the first gripping member and another surface. The gripping force exerted by the first gripping member may be at least partially determined by the magnetic field strength of the first and/or second magnetic elements. By operating the second magnetic element in the second mode, the magnetic interaction between the first and second magnetic elements may at least partially cease and the biasing force exerted by the first biasing member may retain the first gripping member in the first position. The apparatus may switch between gripping and releasing without the generation of particles caused by surfaces rubbing against one another which may otherwise contaminate the object. In particular, the gripping apparatus may be configured such that none of the surfaces of the first gripping member, first magnetic element, first biasing member and second magnetic element rub together during operation. The gripping apparatus may additionally or alternatively be configured such that none of the surfaces of the second gripping member, third magnetic element, second biasing member and fourth magnetic element rub together during operation. In this way, the possibility of loose particles being created owing to friction between surfaces of mechanical parts which slide over one another or rub against one another is minimized. This may be particularly desirable in the case of a pellicle assembly tool for a lithographic system or in other "clean-room" environments, such as in manufacturing facilities and laboratory environments.

The apparatus may comprise a plurality of first gripping members, each comprising a first magnetic element. The second magnetic element may be suitably sized to be able to interact with each of the first magnetic elements of each of the first gripping members. Alternatively, a plurality of second magnetic elements may be provided. In some embodiments, one second magnetic element may be provided per each first gripping member (or per each first magnetic element). In other embodiments, fewer second magnetic elements may be provided than first magnetic elements. For example, one second magnetic element may be configured to interact with two or three or more first magnetic elements.

In an embodiment, the apparatus may further comprise a second gripping member, comprising a third magnetic element and moveable between a first position and a second position; a second biasing member configured to bias the second gripping member toward the first position; and a fourth magnetic element selectively operable in a first mode, in which the fourth magnetic element interacts with the third magnetic element to overcome the second biasing member and move the second gripping member to the second position, and a second mode, in which the fourth magnetic element does not overcome the second biasing member, such that the second gripping member rests in the first position. The first and second gripping members may be configured to cooperate in a pincer motion.

In other words, the first and second gripping members may be arranged on either side of an object to be gripped such that, when moved from the respective first positions to the respective second positions, the first and second gripping members grip the object between them. The magnetic field strengths of the various magnetic elements may be calibrated such that an equal relative amount of force is exerted by each of the first and second gripping members. Alternatively, it may be desirable for the respective magnetic field strengths of the various magnetic elements to be calibrated such that different ones of the first and second gripping members exert different relative amounts of force.

The apparatus may comprise a plurality of second gripping members, each comprising a third magnetic element. The fourth magnetic element may be suitably sized to be able to interact with each of the third magnetic elements of each of the second gripping members. Alternatively, a plurality of fourth magnetic elements may be provided. In some embodiments, one fourth magnetic element may be provided per each second gripping member (or per each third magnetic element). In other embodiments, fewer fourth magnetic elements may be provided than third magnetic elements. For example, one fourth magnetic element may be configured to interact with two or three or more third magnetic elements.

A plurality of first and/or second gripping members may be provided. For example, two or three or more first gripping members may be provided. In addition or alternatively, two or three or more second gripping members may be provided. In particular, it may be desirable to provide a larger number of gripping members where an object to be gripped and/or handled is large or where it is desired to spread the gripping force between different points of contact with the object. The first and second gripping members may be arranged opposite one another. Alternatively or in addition, some or all of the first and second gripping members may be arranged such that they are offset from one another.

In an embodiment, the first gripping member may comprise an arm.

In an embodiment, one or both of the first and second magnetic elements may comprise a permanent magnet, an electromagnet or an electropermanent magnet. One or both of the third and fourth magnetic elements may comprise a permanent magnet, an electromagnet or an electropermanent magnet.

By way of example, the first magnetic element and/or the third magnetic element may comprise a permanent magnet, and the second magnetic element and/or the fourth magnetic element may comprise an electromagnet or an electropermanent magnet. An electropermanent magnet may be preferred as it retains its magnetization even without an active power supply, whereas an electromagnet requires an active power supply in order to retain its magnetization. The second and/or fourth magnetic elements may also comprise permanent magnets which can be moved closer to or further away from the first and/or third magnetic elements, respectively, within a housing, thereby to interact with the first and/or third magnetic elements depending on the proximity of one to the other. For example, the second and/or fourth magnetic elements may comprise a permanent magnet mounted on a mechanical or electrical actuator which moves back and forth between a first position which is closer to the first or third magnetic element, respectively, and a second position which is further away from the first or third magnet element, respectively, than the first position. The housings may ensure that any particles produced by movement of the second and/or fourth magnetic elements cannot reach the object to be gripped and/or handled. In other words, the first and second modes of the second and/or fourth magnetic elements may be selectively operable depending on the presence (and/or direction) of a power supply, or based on the proximity of the second and/or fourth magnetic elements to the first and/or third magnetic elements, respectively.

The first and second magnetic elements may be selectively operable to repel one another. Alternatively or in addition, the first and second magnetic elements may be selectively operable to attract one another.

The third and fourth magnetic elements may be selectively operable to repel one another. Alternatively or in addition, the third and fourth magnetic elements may be selectively operable to attract one another.

In some embodiments, the poles of any of the first, second, third and/or fourth magnetic elements may be selectively reversible.

The first and/or second biasing member may be a leaf spring.

The second magnetic element may be provided with a housing. In such embodiments, the apparatus is configured such that the first gripping member does not engage with the housing of the second magnetic element in the first position. In addition or alternatively, the fourth magnetic element may be provided with a housing. In such embodiments, the apparatus is configured such that the second gripping member does not engage with the housing of the fourth magnetic element in the first position.

According to a second aspect, there is provided a pellicle assembly tool comprising the apparatus according to the first aspect, wherein the pellicle assembly tool is configured to use the apparatus to selectively grip a component.

According to a third aspect, there is provided a lithographic system comprising a pellicle assembly tool according to the second aspect.

According to a fourth aspect, there is provided a cassette for use in a pellicle assembly, comprising: a pressure plate comprising at least one apparatus according to the first aspect; a base member for supporting a pellicle frame; a hood; and a clamp; wherein the pressure plate is arranged so as to rest on the base member, the hood is arranged so as to cover the pressure plate and rest on the base member and the clamp is configured to clamp the hood to the base member. The pressure plate may comprise a plurality of apparatus according to the first aspect. The base member may comprise a heater.

According to a fifth aspect, there is provided a pellicle cassette assembly apparatus, comprising a pressure plate lift and kinematic mount, wherein the kinematic mount is configured to move so as to be positioned below the pressure plate lift, and the pressure plate lift is configured to lower a pressure plate onto a cure carrier positioned on the kinematic mount and subsequently release the pressure plate.

According to a sixth aspect, there is provided a computer-implemented method for curing a pellicle, comprising causing a pellicle cassette assembly tool to: retrieve a pellicle fixture from a fixture carrier; arrange a pellicle frame on a base member of a pellicle cassette; attach the pellicle fixture and a pellicle film to the pellicle frame using an adhesive; apply pressure to the pellicle fixture and the pellicle film using a pressure plate arranged to rest on the base member; and arrange a hood over the pressure plate such that it rests on the pressure plate and on the base member. The method may further comprise clamping the hood to the base member. Retrieving the pellicle fixture from the fixture carrier may comprise gripping the fixture using an apparatus according to the first aspect such that the fixture can be lifted from the fixture carrier and moved to the pellicle frame.

According to a seventh aspect, there is provided a pellicle assembly tool comprising a pellicle cassette assembly tool configured to assemble a pellicle cassette and feed the cassette to a carousel configured to hold a plurality of pellicle cassettes for storage while the pellicle cassette assembly tool assembles further pellicle cassettes. The pellicle cassette assembly tool may be configured to perform method of the sixth aspect.

According to an eighth aspect, there is provided a cassette for use in a pellicle assembly, comprising: a base member; an intermediate member for supporting a pellicle fixture at a predetermined position within the cassette; a pressure plate comprising at least one pressure finger configured to apply pressure to a pellicle film and/or the pellicle fixture; wherein in use the intermediate member is disposed between the base member and the pressure plate.

The base member may comprise at least one clamp for clamping the intermediate member and/or the pressure plate.

The at least one clamp may comprise a magnetic element configured to provide a clamping magnetic field.

The magnetic element may be rotatable so as to vary a strength of the clamping magnetic field.

The magnetic element may comprise a plurality of permanent magnets. For example, the magnetic element may comprise a plurality of neodymium magnets.

The base plate may comprise at least one aperture to enable detection of the intermediate member, the pellicle frame and/or the pellicle film by a positioning sensor of a positioning apparatus. The positioning apparatus may include a positioning sensor disposed 'beneath' the base member, that is to say disposed on the opposite side of the base member to the side which faces towards the intermediate member and pressure plate. It will be appreciated that positioning sensor can take any appropriate form as will be readily apparent to the skilled person. In particular, the sensor may be an optical sensor, acoustic sensor, magnetic sensor, or the like.

The base member may comprise at least one support stud configured to support the pellicle frame. In addition, the base member may comprise at least one retaining stud configured to prevent the pellicle frame from moving relative the support studs.

The at least one pressure finger may comprise a leaf spring.

The cassette may further comprise a closure member. The closure member acts to seal the cassette to prevent damage to the pellicle. For example, the closure member ensures that particles and/or debris from the external environment cannot reach the pellicle. The closure member may be a hood disposed so as to cover the pressure plate and, optionally, the intermediate member and, optionally the base member. Alternatively, the closure member may be, for example, a closure plate configured to block an aperture in the pressure plate.

A ninth aspect relates to a computer-implemented method of assembling a cassette for curing a pellicle, comprising causing a cassette assembly apparatus to: arrange a base member in a field of view of at least one imaging apparatus; align a pellicle frame with the field of view and positioning the pellicle frame on the base member; and align a pellicle film with the pellicle frame and positioning the pellicle film on the pellicle frame.

The method may further comprise causing the cassette assembly apparatus to: align an intermediate member with the pellicle film and positioning the intermediate member on the base plate.

The method may further comprise causing the cassette assembly apparatus to: clamp the intermediate member to the base plate.

The method may further comprise causing the cassette assembly apparatus to: determine a desired position of a pressure plate with reference to the position of the pellicle film; position the pressure plate at the desired position; and clamp the pressure plate to the base plate. Clamping may involve actuating a magnetic element to provide a clamping magnetic field.

A tenth aspect relates to an apparatus for performing a method according to the ninth aspect, comprising: an imaging apparatus; positioning means for positioning a frame; and positioning means for positioning a film.

The apparatus may further comprise positioning means for positioning an intermediate member. The apparatus may further comprise positioning means for positioning a pressure plate.

Although the following detailed description focuses on the use of the described apparatus and methods in a lithographic system, it will be appreciated that the apparatus and methods disclosed herein may find use in other applications. For example, the apparatus and methods may be used in laboratories, manufacturing plants, automated warehouses, and the like.

BRIEF DESCRIPTION OF THE DRAWINGS

Embodiments of the invention will now be described, by way of example only, with reference to the accompanying schematic drawings, in which:

FIG. 9b schematically shows a detail of FIG. 9a; and

DETAILED DESCRIPTION

Figure 1:
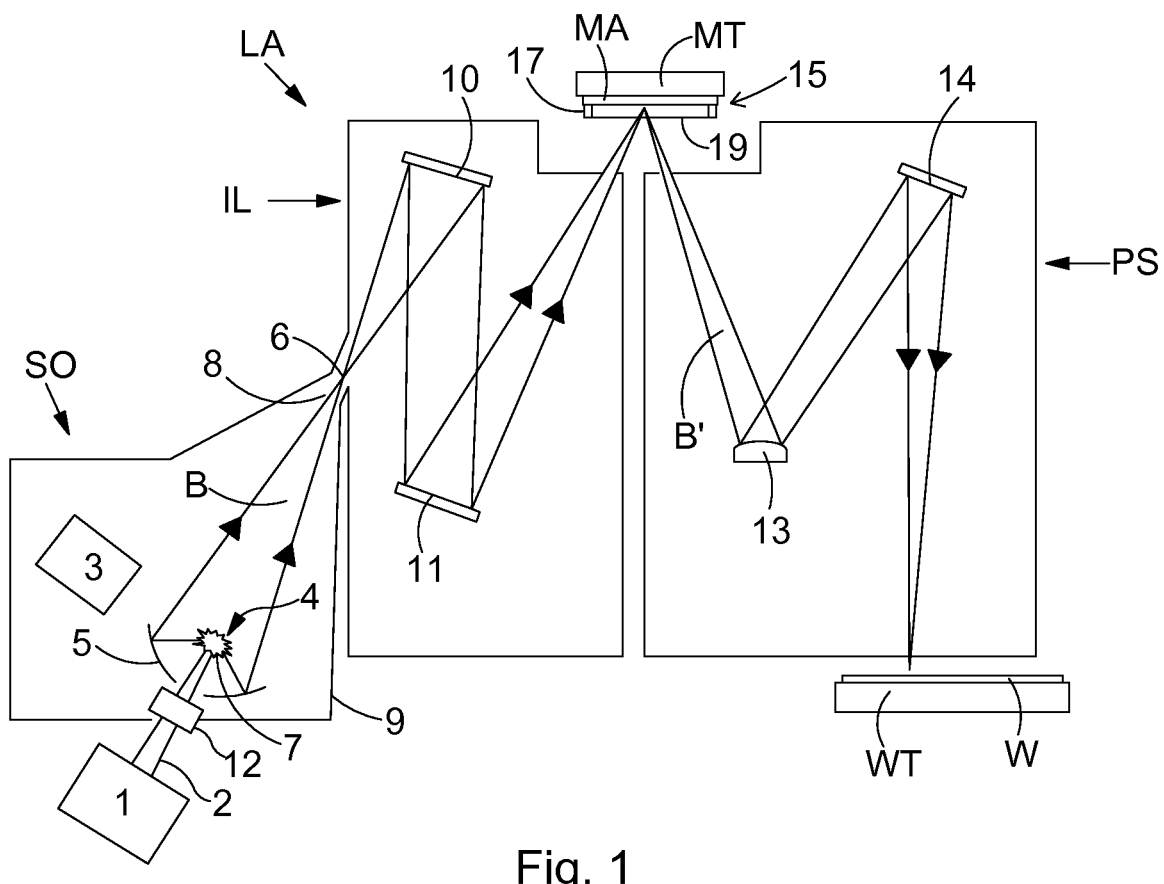
FIG. 1 is a schematic illustration of a lithographic system comprising a lithographic apparatus and a radiation source.

FIG. 1 shows a lithographic system including a mask assembly 15 as described herein. The lithographic system comprises a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W. The illumination system IL is configured to condition the EUV radiation beam B before the EUV radiation beam B is incident upon the patterning device MA. The projection system PS is configured to project the patterned EUV radiation beam B' onto the substrate W. The substrate W may include previously formed patterns. Where this is the case, the lithographic apparatus LA aligns the image, formed by the patterned EUV radiation beam B', with a pattern previously formed on the substrate W.

The radiation source SO, illumination system IL, and projection system PS may all be constructed and arranged such that they can be isolated from the external environment. A gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The radiation source SO shown in FIG. 1 is of the LPP type. A laser 1, which may be a $CO_2$ laser, is arranged to deposit energy via a laser beam 2 into a fuel, such as tin (Sn), that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The deposition of laser energy into the tin creates a plasma 7 at the plasma formation region 4. Radiation, including EUV radiation, is emitted from the plasma during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g., EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source, the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis O.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source SO.

The radiation beam B passes from the radiation source SO into the illumination system IL, which is configured to condition the radiation beam B. The illumination system IL may include a faceted field mirror device 10 and a faceted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the mask assembly 15 held by the support structure MT. The mask assembly 15 includes a patterning device MA and a pellicle 19, which is held in place by a pellicle frame 17. The patterning device MA reflects and patterns the radiation beam B. The illumination system IL may include other mirrors or devices in addition to or instead of the faceted field mirror device 10 and faceted pupil mirror device 11.

Following reflection from the patterning device MA, the patterned radiation beam B enters the projection system PS. The projection system PS comprises a plurality of mirrors that are configured to project the radiation beam B onto a substrate W held by the substrate table WT. The projection system PS may apply a reduction factor to the radiation beam B, forming an image with features that are smaller than the corresponding features on the patterning device MA. A reduction factor of 4 may for example be applied. Although the projection system PS has two mirrors in FIG. 1, the projection system may include any number of mirrors (e.g., six mirrors).

The lithographic apparatus may, for example, be used in a scan mode, wherein the support structure (e.g., mask table) MT and the substrate table WT are scanned synchronously while a pattern imparted to the radiation beam is projected onto a substrate W (i.e., a dynamic exposure). The velocity and direction of the substrate table WT relative to the support structure (e.g., mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system, the radiation source SO may take other forms. For example, in alternative embodiments the radiation source SO may comprise one or more free electron lasers. The one or more free electron lasers may be configured to emit EUV radiation that may be provided to one or more lithographic apparatus.

As was described briefly above, the mask assembly 15 includes a pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. The pellicle 19 comprises a thin film that is substantially transparent to EUV radiation (although it will absorb a small amount of EUV radiation). By EUV transparent pellicle or a film substantially transparent for EUV radiation herein is meant that the pellicle 19 is transmissive for at least 65% of the EUV radiation, preferably at least 80% and more preferably at least 90% of the EUV radiation. The pellicle 19 acts to protect the patterning device MA from particle contamination.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and the pattern that is transferred to the substrate W. The pellicle 19 advantageously provides a barrier between the patterning device MA and the environment in the lithographic apparatus LA in order to prevent particles from being deposited on the patterning device MA.

The pellicle 19 is positioned at a distance from the patterning device MA that is sufficient that any particles that are incident upon the surface of the pellicle 19 are not in the focal plane of radiation beam B. This separation between the pellicle 19 and the patterning device MA acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In the absence of other considerations, it may be desirable to position the pellicle 19 a considerable distance away from the patterning device MA. However, in practice, the space which is available in the lithographic apparatus LA to accommodate the pellicle 19 is limited due to the presence of other components. In some embodiments, the separation between the pellicle 19 and the patterning device MA may, for example, be approximately between 1 mm and 10 mm, for example between 1 mm and 5 mm, more preferably between 2 mm and 2.5 mm.

A mask assembly may be prepared for use in a lithographic apparatus by attaching a pellicle to a pellicle frame and by attaching the pellicle frame to a patterning device. A mask assembly comprising a patterning device MA and a pellicle supported adjacent to the patterning device by a pellicle frame may be prepared remotely from a lithographic apparatus LA and the mask assembly may be transported to the lithographic apparatus LA for use in the lithographic apparatus LA. For example, a pellicle frame supporting a pellicle may be attached to a patterning device, so as to form a mask assembly, at a site at which a pattern is imparted onto the patterning device. The mask assembly may then be transported to a separate site at which a lithographic apparatus LA is situated and the mask assembly may then be provided to the lithographic apparatus LA for use in the lithographic apparatus LA.

A mask assembly in which a pellicle is held in place by a pellicle frame may be delicate and transport of the mask assembly may risk damage to the pellicle. Assembling a mask assembly in a separate environment to a lithographic apparatus LA may additionally result in the mask assembly being exposed to a variety of pressure conditions. For example, a mask assembly may be transported to a lithographic apparatus under ambient pressure conditions. The mask assembly may then be loaded into the lithographic apparatus LA via a load lock which is pumped to vacuum pressure conditions. Changes in the pressure conditions to which a mask assembly is exposed may cause a pressure difference to exist across a pellicle which may cause the pellicle to bend and may risk damage to the pellicle. In an embodiment, a lithographic system may comprise a lithographic apparatus LA connected to a pellicle frame attachment apparatus (or pellicle assembly tool). Where this is the case, a mask assembly comprising a mask and pellicle may be transferred directly from the pellicle frame attachment apparatus to the lithographic apparatus whilst remaining in a controlled environment (e.g., a vacuum environment).

Figure 2A:
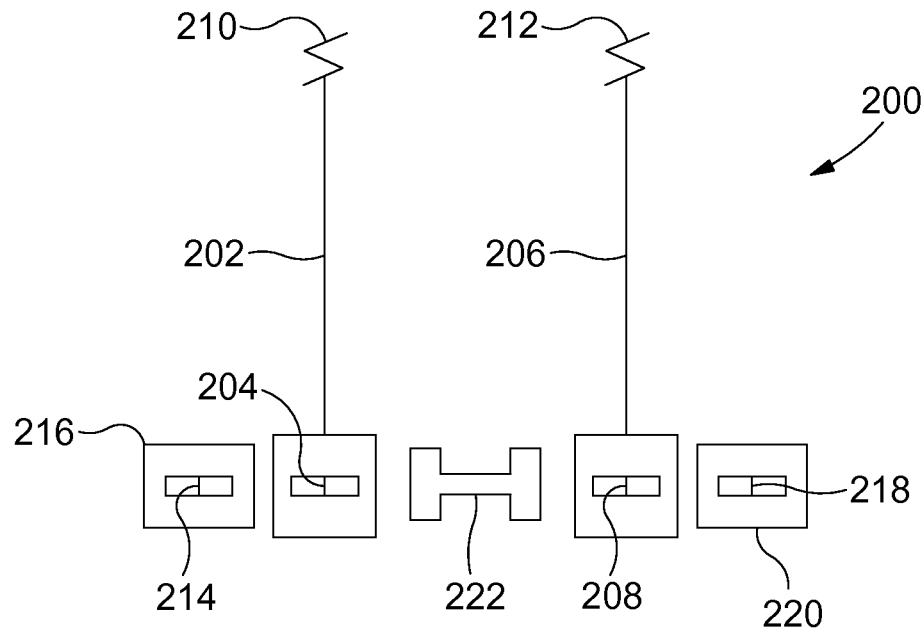
FIG. 2a is a schematic illustration of a gripping apparatus with gripping members in a first position.
Figure 2B:
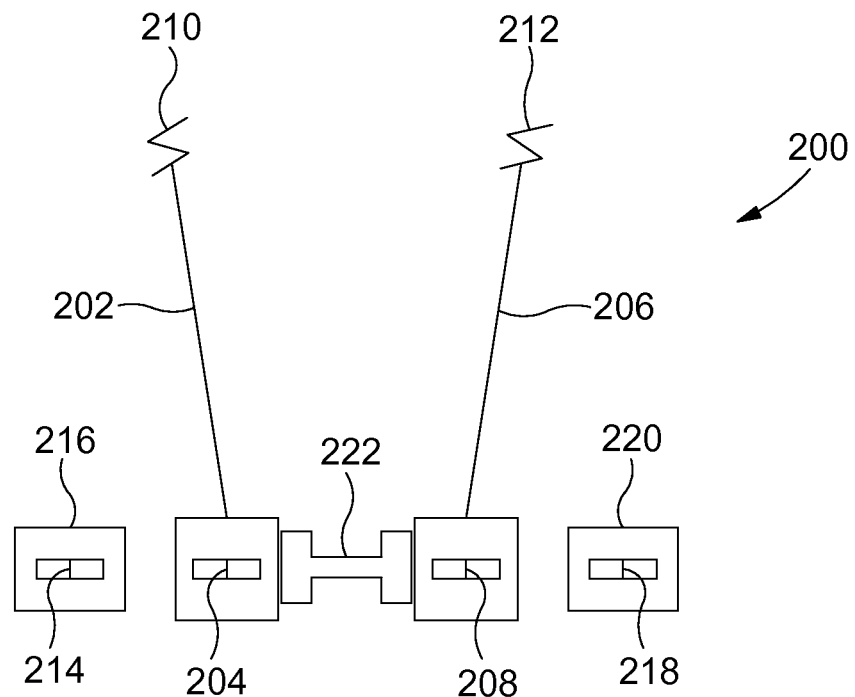
FIG. 2b is a schematic illustration of the gripping apparatus of FIG. 2a with gripping members in a second position.

FIGS. 2a and 2b show a gripping apparatus 200 according to an embodiment. The gripping apparatus may be used, for example, in the process of assembling or transporting the mask assembly. The gripping apparatus 200 comprises a first gripping member 202 and a second gripping member 206 arranged substantially parallel with respect to one another. The first and second gripping members 202, 206 can selectively cooperate in a pincer motion to grip an object 222 located between the two gripping members 202, 206 (as shown in FIG. 2b). In other words, the first and second gripping members 202, 206 are each moveable between a respective first position (shown in FIG. 2a) and a respective second position (shown in FIG. 2b) in order to grip or release the object 222. In the present embodiment, the gripping members 202, 206 each comprise an arm. It will be appreciated that the gripping members may take any suitable form, however. The first gripping member 202 comprises a first magnetic element 204, which is arranged at one end of the first gripping member 202. It will be appreciated, however, that other positions of the first magnetic element 204 may be suitable. The first magnetic element 204 may comprise, for example, an electromagnet, a permanent magnet or an electropermanent magnet. In the illustrated embodiment, a first biasing member 210 is provided at the other end of the first gripping member 202 to the first magnetic element 204. The first biasing member 210 may be a leaf spring, but may take any other suitable form. The first biasing member 210 serves to bias the first gripping member 202 toward the first position. It will be appreciated that the first biasing member 210 may be located in any suitable position in which it can bias the first gripping member 202. The gripping apparatus 200 also comprises a second magnetic element 214 located in the vicinity of the first magnetic element 204 sufficiently proximate for the magnetic fields of the first and second magnetic elements 204, 214 to interact. The second magnetic element 214 may comprise, for example, an electromagnet, a permanent magnet or an electropermanent magnet. The second magnetic element 214 may be provided in a housing 216. The housing 216 may comprise, for example, aluminium. The second magnetic element 214 is selectively operable in a first mode, in which the second magnetic element 214 interacts with the first magnetic element 204 to overcome the first biasing member 210 and move the first gripping member 202 to the second position, and a second mode, in which the second magnetic element 214 does not overcome the first biasing member 210, such that the first gripping member 202 rests in or returns to its first position. In the presently described embodiment, the second magnetic element 214 is configured to repel the first magnetic element 204 when operating in the first mode. The magnetic field strengths of the first and second magnetic elements 204, 214 at least partially determine the strength of a gripping force with which the first gripping member 202 can grip the object 222.

The second gripping member 206 comprises a third magnetic element 208, which is arranged at one end of the second gripping member 206. It will be appreciated, however, that other suitable positions of the third magnetic element 208 are possible. The third magnetic element 208 may be, for example, an electromagnet, a permanent magnet or an electropermanent magnet. In the illustrated embodiment, a second biasing member 212 is provided at the other end of the second gripping member 206 to the third magnetic element 208. The second biasing member 212 may be a leaf spring. The second biasing member 212 serves to bias the second gripping member 206 toward a first position. It will be appreciated that the first biasing member 212 may be located in any suitable position in which it can bias the second gripping member 206. The gripping apparatus 200 also comprises a fourth magnetic element 218 located in the vicinity of the third magnetic element 208 sufficiently proximate for the magnetic fields of the third and fourth magnetic elements 208, 218 to interact. The fourth magnetic element 218 may be, for example, an electromagnet, a permanent magnet or an electropermanent magnet. The fourth magnetic element 218 may be provided in a housing 220. The housing 220 may comprise, for example, aluminium. The fourth magnetic element 218 is selectively operable in a first mode, in which the fourth magnetic element 218 interacts with the third magnetic element 208 to overcome the second biasing member 212 and move the second gripping member 206 to the second position, and a second mode, in which the fourth magnetic element 218 does not overcome the second biasing member 212, such that the second gripping member 206 rests in or returns to its first position.

In the depicted example, the gripping members 202, 206 do not engage the housings 216, 220 when in the first position. In this way, particle generation may be minimized. The biasing members 210, 212 may be tuned to ensure that the gripping members 202, 206 cannot come into contact with the housings 216, 220.

The first and second modes of the second and/or fourth magnetic elements 214, 218 may be configured depending on the presence (and/or direction) of a power supply, or based on the proximity of the second and/or fourth magnetic elements 214, 218 to the first and/or third magnetic elements 204, 208, respectively. For example, if the second magnetic element 214 is an electromagnet, the first mode may be configured by connecting a power supply to magnetize the second magnetic element 214. The first and second magnetic elements 204, 214 will repel one another if facing magnetic poles of the first and second magnetic elements 204, 214 are the same. The second mode would be selectable by disconnecting the power supply and thereby demagnetizing the second magnetic element. Alternatively, if the second magnetic element 218 is a permanent magnet, it may be configured to move within the housing 216 to be closer to or further away from the first magnetic element 204. For example, the second magnetic element may comprise a permanent magnet mounted on a mechanical or electrical actuator which moves back and forth between a first position which is relatively closer to the first magnetic element, and a second position which is further away from the first magnet element than the first position. The respective magnetic field strengths of the first and second magnetic elements 204, 214 may be configured such that the magnetic elements repel one another when the second magnetic element 214 is moved closer to the first magnetic element 204 within the housing 216 and such that the magnetic interaction between the first and second magnetic elements 204, 214 reduces as the second magnetic element 214 is moved away from the first magnetic element 204 within the housing 216, i.e. the repulsion is at least partially stopped. The housing 216 can be configured to surround the second magnetic element 214 such that particles which may be released by the movement of the second magnetic element 214 within the housing 216 cannot reach the object 222. The above applies equally to the third and fourth magnetic elements 208, 218. Use of an electropermanent magnet may allow for reduced operating power requirements and allow for continued gripping in the event of a power failure. If the second magnetic element 218 is an electropermanent magnet, the poles of the second magnetic element 218 may be switched in order to move the gripping member 202 between the first and second positions. In particular, to move the gripping member 202 from the first position to the second position, the second magnetic element 218 may be operated so as to repel the first magnetic element 204, while in order to move the gripping member 202 from the second position to the first position, the second magnetic element 218 may be operated so as to attract the first magnetic element 204.

In the embodiment illustrated in FIGS. 2a and 2b, the respective first positions of the first and second gripping members 202, 206 are positions in which the first and second gripping members 202, 206 do not engage with the object 222 (shown in FIG. 2a) and the respective second positions are positions in which the first and second gripping members 202, 206 engage with the object 222 so as to grip the object 222 (shown in FIG. 2b). It will be appreciated, however, that the respective first positions may be positions in which the first and second gripping members 202, 206 do engage with the object 222 so as to grip the object 222, and the respective second positions may be positions in which the first and second gripping members 202, 206 do not engage with the object 222.

While two gripping members 202, 206 are depicted in FIGS. 2a, 2b, it will be appreciated that any number of gripping members may be provided. Similarly, while each gripping member 202, 206 and each of the first and third magnetic elements 204, 208 have respective corresponding second and fourth magnetic elements 214, 218, it will be appreciated that other configurations may be provided.

FIGS. 3a to 3d are schematic illustrations of steps involved in assembling a pellicle. A pellicle comprises a frame 320, one or more fixtures 316 attached to the frame 320 and a film 322, which is also attached to the frame. The pellicle may be assembled using a pellicle assembly tool. During assembly of a pellicle, the fixtures 316 and film 322 are attached to the frame 320 using an adhesive. The adhesive may subsequently be cured. A pellicle may be required to comply with strict requirements regarding, for example, flatness of the pellicle, accuracy of alignment between the various components of the pellicle, strength of the glued connections and cleanliness of the pellicle. In particular, the pellicle may be required to have a flatness tolerance of less than 50 μm and a positioning tolerance of less than 35 μm.

Figure 3A:
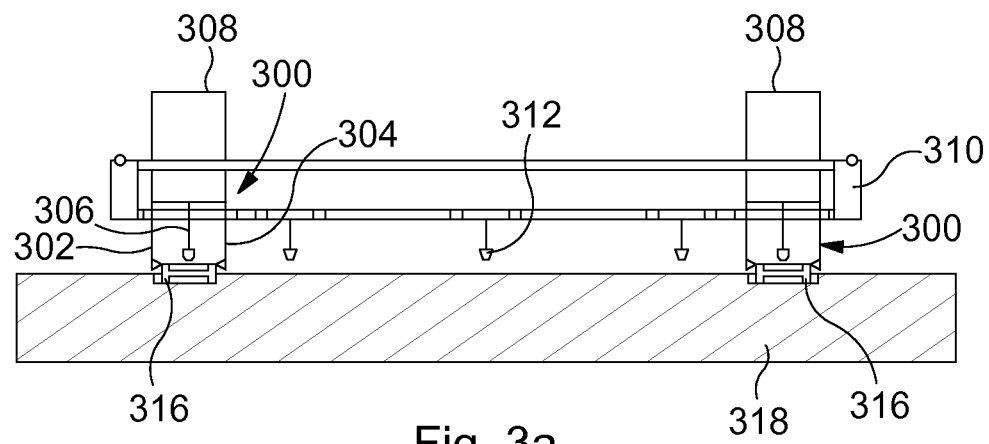
FIGS. 3a to 3d are schematic illustrations of steps involved in assembling a pellicle.

The pellicle assembly tool comprises a pressure plate 310 having a plurality of film pressure fingers 312 to apply pressure to the film while the adhesive cures. The pressure plate 310 also comprises two gripping apparatus 300 which can be used to grip and/or manipulate the pellicle by gripping the fixtures 316. It will be appreciated that what is shown in the figures is for illustrative purposes only and that more or fewer fixtures 316 and/or gripping apparatus 300 may be provided. For example, four fixtures 316 and four gripping apparatus 300 may be provided. Each gripping apparatus 300 comprises a first gripping member 302 and a second gripping member 304, which are arranged substantially parallel with respect to one another. The first and second gripping members 302, 304 of a gripping apparatus 300 can selectively cooperate in a pincer motion to grip a fixture 316. The gripping apparatus 300 shown in FIGS. 3a to 3d are normally closed. Each gripping apparatus 300 comprises a gripper actuator 308 which operates to open (i.e. move apart) the gripping members 302, 304 and to close them again. The gripper actuator 308 may be implemented as one or more magnetic elements, as described above in relation to FIGS. 2a and 2b. The gripping apparatus 300 also comprises at least one fixture pressure finger 306 to apply pressure to the fixtures 316 while these are being affixed to the frame 320. The frame 320 is arranged on a cure carrier 324 which supports the frame 320 while the pellicle is constructed. The cure carrier 324 may also be referred to as a base member. A hood 328 is provided to cover the pressure plate 310 and the pellicle in order to protect the pellicle while the adhesive is cured. The hood 328 can be fastened onto the cure carrier 324 by way of a fastener. It will be appreciated that any appropriate fastener may be used. In an embodiment, the hood 328 may be fastened to the cure carrier 324 using clamps 326, as described in more detail below. Sealing members 314, 315 (for example, o-rings) are provided to ensure a tight seal between the pressure plate 310 and the cure carrier 324, and between the pressure plate 310 and the hood 328. The whole assembly comprising pellicle arranged on the cure carrier 324, pressure plate 310 and hood 328, as illustrated in FIG. 3d, may be referred to as a pellicle cassette 330. A pellicle cassette 330 ensures pellicle flatness within the desired tolerance (for example, less than 50 μm), enables accurate positioning of pellicle components and clamps the pellicle during adhesive curing such that no relative movement of the components can occur during curing. In addition, the hood 328 ensures that no particles can land on the pellicle during curing and thus ensures that defects owing to contamination cannot arise in the pellicle during curing.

Steps for forming a pellicle cassette 330 will now be described in more detail with reference to FIGS. 3a to 3e. In an initial step 30, the fixtures 316 are collected from a fixture carrier 318 using the gripping apparatus 300 on the pressure plate 310. In particular, the pressure plate 310 is moved to be located above the fixture carrier 318 and lowered towards the fixtures 316 located on the fixture carrier 318. The fixtures 316 are located at a defined location and orientation on the fixture carrier 318. The alignment between the pressure plate 310, specifically the gripping apparatus 300 of the pressure plate 310, and the fixtures 316 is established and verified using a visual measurement system (e.g. using cameras/other image sensors and appropriate image recognition techniques). The gripping members 302, 304 of the gripping apparatus 300 are normally closed. The gripping members 302, 304 are opened (i.e. moved apart) by the gripper actuator 308 and the pressure plate is lowered until the gripping apparatus 300 are able to grip the individual fixtures 316. The gripper actuator 308 then operates to close the gripping members 302, 304 again such that the fixtures 316 are each held by a gripping apparatus 300, as shown in FIG. 3a.

The pressure plate 310 with gripping apparatus 300 holding the fixtures 316 can then be moved in a subsequent step 32 so as to be arranged above a cure carrier 324 on which a pellicle can be constructed. As described above, the pellicle comprises a frame 320 to which the fixtures 316 and a film 322 are attached using adhesive. In some embodiments, the same adhesive may be used to attach the fixtures 316 and the film 322 to the frame 320. In other embodiments, different adhesives may be used to attach the fixtures 316 to the frame 320 than those used to attached the film 322 to the frame 320.

Figure 3B:
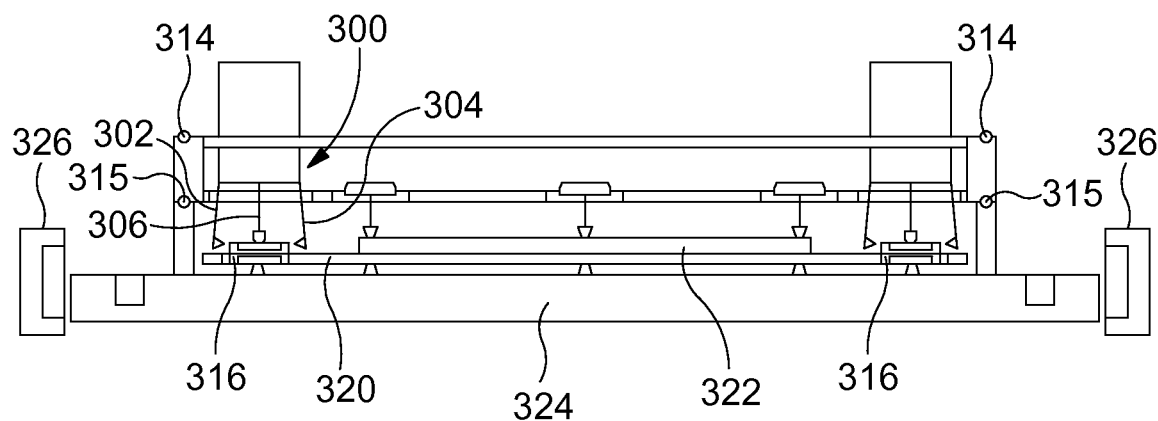
Figure 3C:
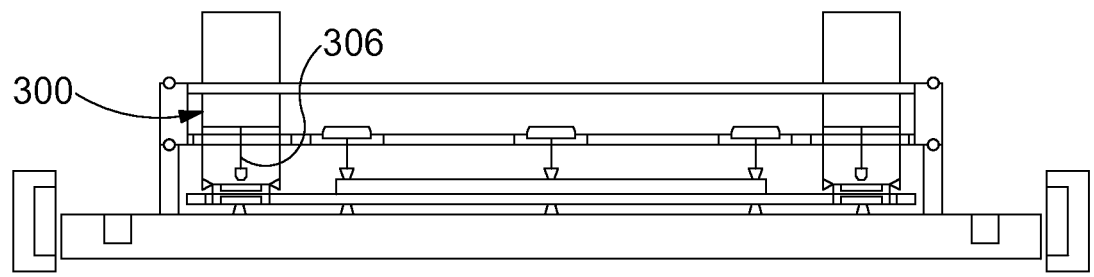
Figure 3D:
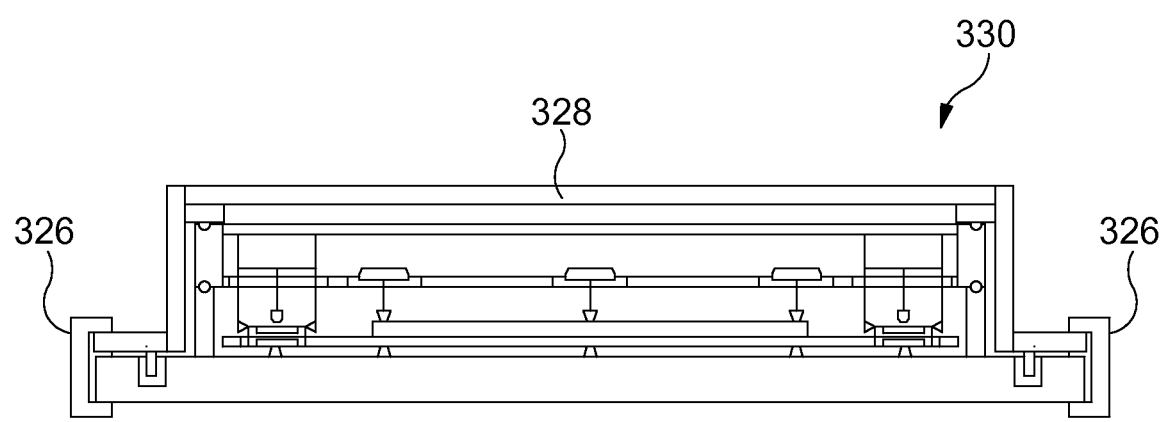
Figure 3E:
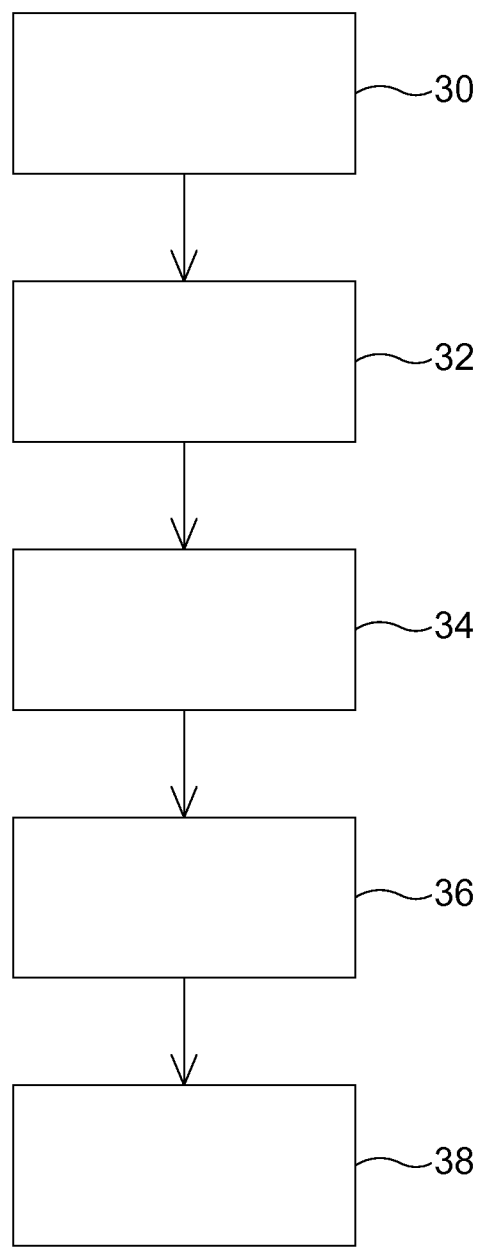
FIG. 3e is a schematic illustration of a method of assembling a pellicle.

After the fixtures 316 and the film 322 have been applied to the frame 322, the gripper actuators 308 operate in a step 34 to open the gripping members 302, 304 and to engage the fixture pressure fingers 306 to apply pressure to the fixtures 316 so as to push the fixtures 316 onto the frame 320, as shown in FIG. 3b. After the fixtures 316 have been pushed onto the frame 320, the gripper actuators 308 operate in a step 36 to close the gripping members 302, 304 of the gripping apparatus 300 again and remove the fixture pressure fingers 306 from the surface of the fixtures 316 (i.e. relieve the pressure on the fixtures 316), as shown in FIG. 3c. Film pressure fingers 312 attached to the pressure plate apply pressure to clamp the film 322 in place on the frame 320 while the adhesive cures (shown, for example, in FIGS. 3b and 3c).

In a final step 38 for constructing a pellicle cassette 330, a hood 328 is arranged over the top of the pressure plate 310 and held in place using clamps 326. As a result of the hood 328 being clamped over the pressure plate 310, and of the film pressure fingers 312 clamping the pellicle film 322 in place on the pellicle frame 320, the pellicle cassette 330 can be moved freely without risk of damage occurring to the fragile pellicle. Constructing a pellicle cassette 330 takes significantly less time than the time required to cure the adhesive used to attach the film 322 and/or the fixtures 316 to the frame 320. Since a cassette may be freely moved without risk of damage to the pellicle, this means that a cassette 330 may be constructed in a pellicle assembly tool and then moved to a storage area while the adhesive finishes the curing process. As a result, the throughput of the pellicle assembly time may be increased as further pellicle cassettes 330 can be constructed while the adhesive in a first pellicle cassette 330 cures. Once the adhesive in the first pellicle has cured, the first pellicle cassette 330 can be retrieved from a storage area and further processed according to requirements. It will be appreciated that other steps which are apparent to the skilled person may also be involved in constructing a pellicle cassette 330.

Figure 4A:
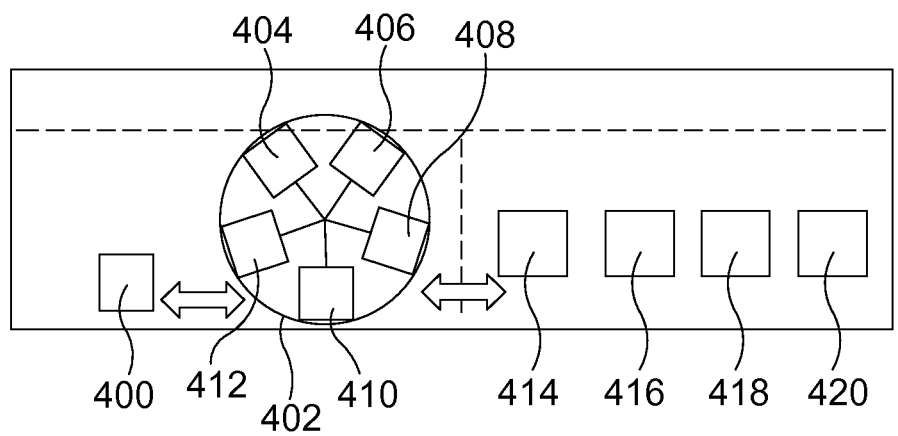
FIG. 4a is a schematic illustration of part of a pellicle assembly tool.

FIG. 4a shows a schematic layout for a part of a pellicle assembly tool. The pellicle assembly tool comprises a preparation station 400, a carousel 402 having storage areas 404, 406, 408, 410 for storing pellicle cassettes while the adhesive cures and a post-preparation area 412 for transferring components from the preparation station 400 to further stations along the assembly line. The pellicle assembly tool comprises various further stations 414, 416, 418, 420 at which process steps for assembling a pellicle cassette can be performed. For example, fixtures may be collected from a fixture carrier at a first station 414, applied to a frame at a second station 416, the pellicle film may be glued to the frame at a third station 416 and finally the pellicle cassette may be fully assembled at a fourth station 420. It will be appreciated that some of the above tasks may be carried out at the same station and/or further tasks may also be performed during cassette assembly.

Once a finished pellicle cassette has been constructed, for example as described above with reference to FIGS. 3a to 3d, the cassette is passed back to the storage carousel 402 for storage while the adhesive cures. A new pellicle cassette can then be processed on the assembly line. The carousel 402 shown in FIG. 4a has four storage areas; it will be appreciated, however, that any number of storage areas is conceivable.

Figure 4B:
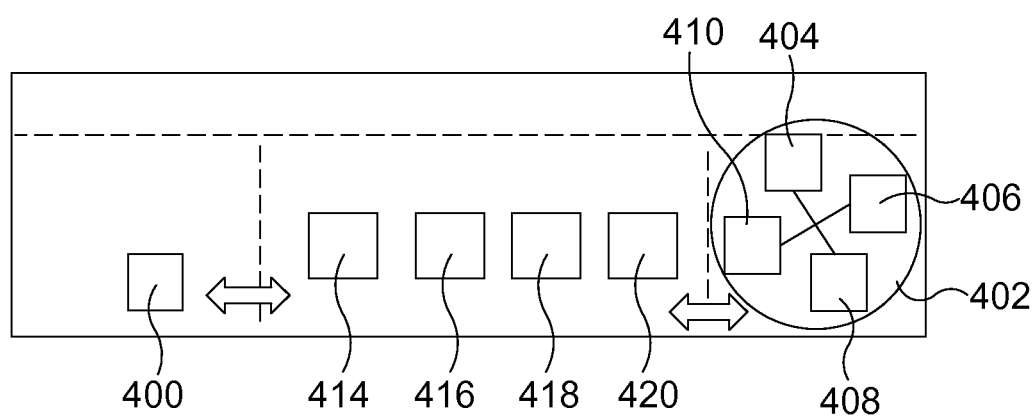
FIG. 4b is a schematic illustration of part of an alternative pellicle assembly tool.

FIG. 4b shows a schematic layout for a part of another pellicle assembly tool. The pellicle assembly tool shown in FIG. 4b differs from that shown in FIG. 4a only in that the carousel 402 is arranged after the cassette assembly stage 420 rather than after the preparation stage 400. This means that a cassette does not need to travel back through the pellicle assembly tool in order to be stored in the carousel 402 during the adhesive curing time. The carousel 402 shown in FIG. 4b also has four storage areas 404, 406, 408, 410. It will be appreciated that more or fewer storage areas may be provided in a carousel of a pellicle assembly tool according to requirements.

Figure 5A:
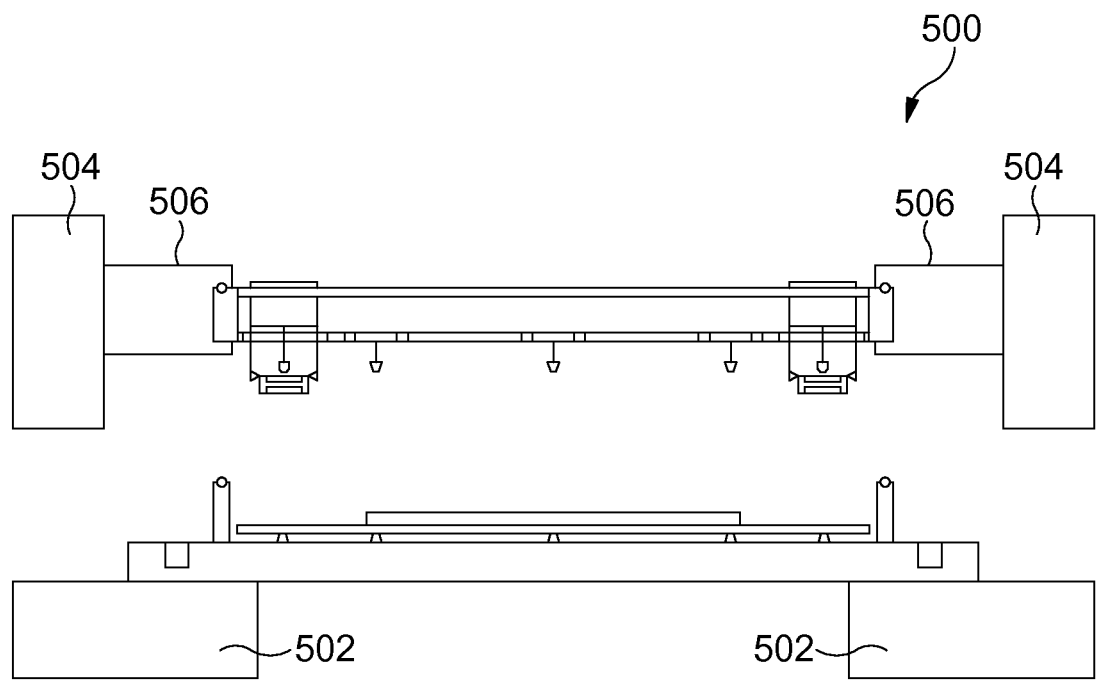
FIGS. 5a and 5b are schematic illustrations of an apparatus for assembling a pellicle.
Figure 5B:
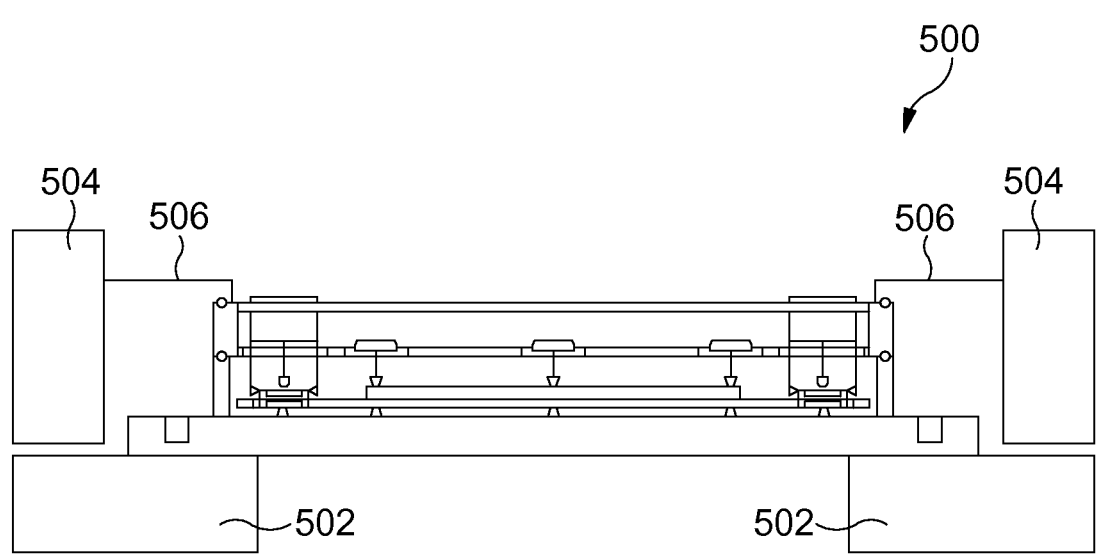

FIGS. 5a and 5b show an apparatus 500 for assembling a pellicle cassette. The apparatus 500 comprises a kinematic mount 502 configured to support a cure carrier on which a pellicle can be constructed, such as that described with reference to FIGS. 3a to 3d. To avoid repetition, features of the cure carrier, pressure plate and pellicle assembly which have already been described with reference to FIGS. 3a to 3d are not further described here. The apparatus 500 further comprises a pressure plate lift having at least two pillars 504 each comprising at least one arm 506 for supporting a pressure plate. The kinematic mount 502 is configured to move such that a cure carrier arranged on the kinematic mount 502 can be positioned below a pressure plate supported by the pressure plate lift. The pressure plate lift is configured to lower the pressure plate onto the cure carrier and subsequently decouple from the pressure plate in order to mount the pressure plate over the cure carrier. The film pressure fingers of the pressure plate then make contact with the pellicle film to press said film onto the pellicle frame. The alignment between the cure carrier and pressure plate may be defined and/or verified using a camera measurement system to give the most accurate alignment possible.

Figure 6A:
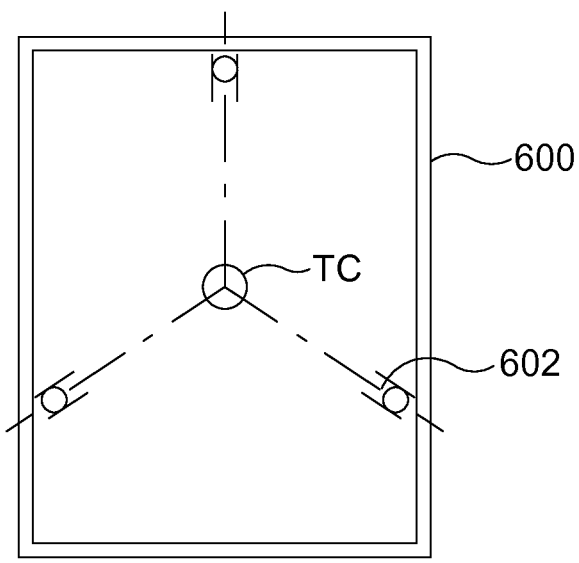
FIG. 6a schematically shows a pellicle frame.
Figure 6B:
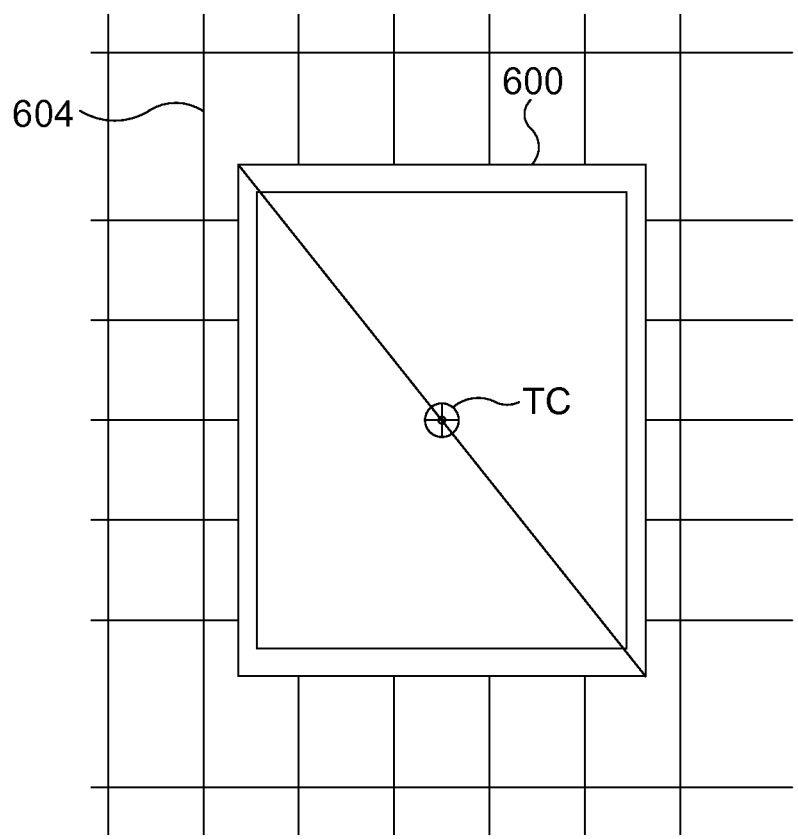
FIG. 6b schematically shows an alternative pellicle frame.

In some embodiments, the mount for the frame of the pellicle, for example the kinematic mount 502, may comprise a heater configured to heat the pellicle frame. Heating the frame may decrease the amount of time required to cure the adhesive. FIG. 6a shows a pellicle frame 600 arranged on a mount 602 having a thermal centre TC. The mount 602 has three limbs which extend outwards from a central point. FIG. 6b shows an alternative arrangement where the frame 600 is arranged on a mount 604 having a grid-like construction. This arrangement may facilitate expansion of the frame 600 under heating.

In some arrangements, the carousel 402 of the pellicle assembly tools depicted in FIGS. 4a, 4b may be provided with a heater as described in connection with FIG. 5.

Figure 7:
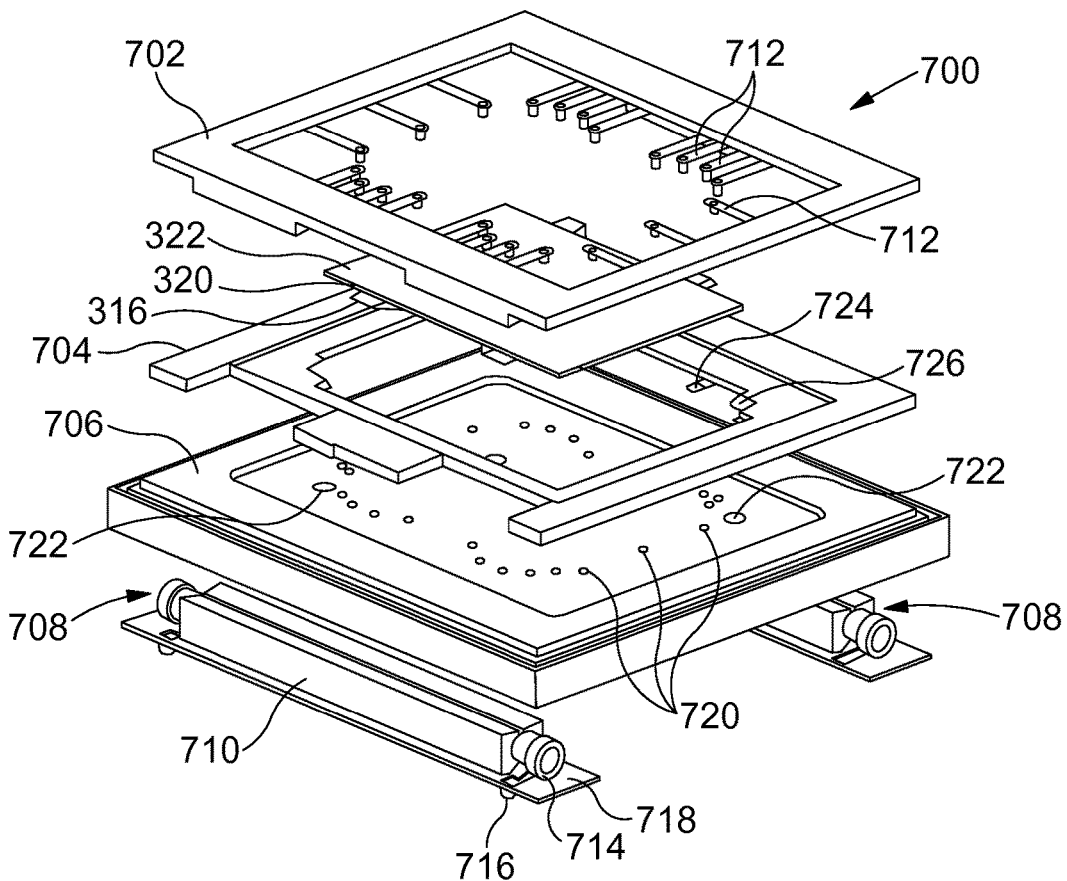
FIG. 7 schematically shows an exploded view of an embodiment of a pellicle cassette.

FIG. 7 shows an exploded view of another example arrangement of a pellicle cassette 700. The pellicle cassette 700 comprises a pressure plate 702, an intermediate member 704 and a base member 706. The intermediate member 704 may be, for example, a fixture load carrier configured to support fixtures 316 of the pellicle. The intermediate member 704 is arranged between the base member 706 and the pressure plate 702. A pellicle, comprising a pellicle frame 320, a pellicle film 322 and fixtures 316 may be supported by the intermediate member 704 and/or the base member 706.

The pressure plate 702 shown in FIG. 7 is generally in the form of a hollow rectangle, that is, the pressure plate 702 forms a frame-like shape with a rectangular aperture. It will be appreciated that the pressure plate 702 may have any suitable shape. A plurality of pressure fingers 712 project from the respective inner edges (those edges facing into the aperture) of the pressure plate 712 towards a respective opposite edge. The pressure fingers 712 are configured to apply pressure to the pellicle film 322 and fixtures 316 during curing of the adhesive used to attach the film 322 and fixtures 316 to the frame 320. By applying pressure to the film 322 and fixtures 316 during curing of the pellicle, it can be ensured that the film 322 and fixtures 316 remain in place relative to the frame 320. It can also be ensured that the pellicle is held in place within the cassette 700. As a result, the pellicle cassette 700 may be moved during curing without risk of the pellicle components becoming misaligned with respect to one another. In some embodiments, the pressure fingers 712 comprise leaf springs. In some embodiments, each pressure finger 712 comprises a contact at its free end (i.e. the end which is remote from the pressure plate 702). The contacts may comprise a soft plastics material, and may, for example, comprise polyether ether ketone (PEEK). Furthermore, the contacts may have a spherical shape and/or a substantially rounded tip. Rounded or spherical contacts may reduce the likelihood of the contacts slipping on the film and/or fixture surfaces. In the embodiment shown in FIG. 7, the pressure plate 702 comprises 22 pressure fingers. It will be appreciated that more or fewer pressure fingers 712 may be provided, according to requirements. In some embodiments, the pressure plate 702 may be provided with a carrier handler interface in which a carrier handler may engage in order to position the pressure plate 702.

The intermediate member 704 shown in FIG. 7 is also generally in the form of a hollow rectangle. However, it will be appreciated that the intermediate member 704 may have any suitable shape. Support lips 724 configured to support pellicle fixtures 316 project from inner edges of the intermediate member 704. In the embodiment shown in FIG. 7, two support lips 724 are provided on each of the two long sides of the intermediate member. It will be appreciated that any suitable number of support lips 724 may be provided. In particular, a respective support lip 724 may be provided for each fixture 316 to be attached to the pellicle frame 320. The support lips 724 may be provided with one or more structures or features (not shown) configured to mate with corresponding structures or features (not shown) on the pellicle fixtures 316 to encourage correct alignment of the pellicle with the intermediate member 704.

The intermediate member 704 also comprises at least one marker 726 for use with a positioning system used to align the components of the pellicle and of the pellicle cassette 700. The marker 726 is configured to be detected by a positioning sensor of a positioning system (not shown) in order to correctly align the intermediate member 704 (with the fixtures 316) and the pellicle frame 320 and/or film 322, as discussed in more detail below with reference to FIGS. 9a and 9b. The marker may be, for example, a segment of the intermediate member 704 which is opaque or reflective to light (e.g. visible light or infrared radiation) in the case of an optical sensor. However, it will be apparent to the skilled person that any marker which can be detected by an appropriate sensor of the positioning system may be used. In some embodiments, the intermediate member 704 may be provided with a carrier handler interface in which a carrier handler may engage in order to position the intermediate member 704.

The base member 706 is configured to support the pellicle, the intermediate layer 704 and the pressure plate 702. The base member 706 comprises studs 720 which project from a surface of the base member 706 to support and/or retain the pellicle. In particular, the studs 720 may comprise support studs on which the pellicle frame 320 can be placed. The studs 720 may also comprise retaining studs configured to prevent the pellicle from moving relative to the support studs. For example, the retaining studs may project further from a surface of the base member 706 than the support studs and be positioned closer to the edges of the base member 706 such that, when the pellicle is placed onto the support studs, the retaining studs surround the pellicle and prevent motion of the pellicle within the plane of the pellicle. Movement of the pellicle in a perpendicular direction can be prevented by the pressure finger(s) 712 of the pressure plate 702.

The base member 706 also comprises at least one aperture 722 configured to allow detection of the intermediate member 704 and/or the pellicle frame 320 and/or the pellicle film 322 by the positioning sensor of the positioning system. In particular, the positioning sensor may be arranged at a side of the base member 706 opposite to the side of the base member 706 which faces the intermediate member 704 and the pellicle. In the embodiment shown in FIG. 7, the base member 706 comprises two apertures 722 in diagonally opposite corners. By providing an aperture in a corner, it is possible to verify the positioning of the components of the pellicle and/or of the intermediate member 704 in two dimensions at once, as discussed in more detail below with reference to FIGS. 9a and 9b. In some embodiments, the base member 706 may be provided with a carrier handler interface in which a carrier handler may engage in order to position the base member 706.

The base member 706 also comprises at least one clamp. In the embodiment shown in FIG. 7, the base member 706 comprises two magnetic clamps 708. It will be appreciated that any suitable number of clamps may be provided. It will further be appreciated that mechanical clamps may be provided instead of or in addition to magnetic clamps 708.

The magnetic clamps 708 each comprise a magnetic flux guide 710, a rotatable magnetic element 714 and an actuator 716 to cause rotation of the rotatable magnetic element 714. In the embodiment shown in FIG. 7, panels 718 are arranged to hold the magnetic clamps 708 in place in the base member 706. The panels 718 are slotted to allow the actuators 716, which are in the form of arms in this embodiment, to project through the panels 718 in order to allow the actuators 716 to be mechanically actuated. It will of course be appreciated that the actuators 716 may take any suitable form. For example, the actuators 716 may be configured to be electrically actuated in order to cause rotation of the magnetic elements 714. It will also be appreciated that, while in some embodiments the magnetic elements 714 may comprise permanent magnets, in other embodiments, the magnetic elements 714 may be in the form of an electromagnet. In particular, the magnetic element 714 may comprise a plurality of neodymium magnets. The clamping force provided by each magnetic clamp 708 may be in the range from 100N to 2000N. It will be appreciated that a higher clamping force enables a more robust cassette 700 since it is less likely that the components will be able to move relative to one another while clamped. For some applications, a minimum clamping force may be specified, depending on requirements. For example, a minimum total clamping force of at least 750N may be desired in order to meet robustness requirements.

Figures 8A, 8B:
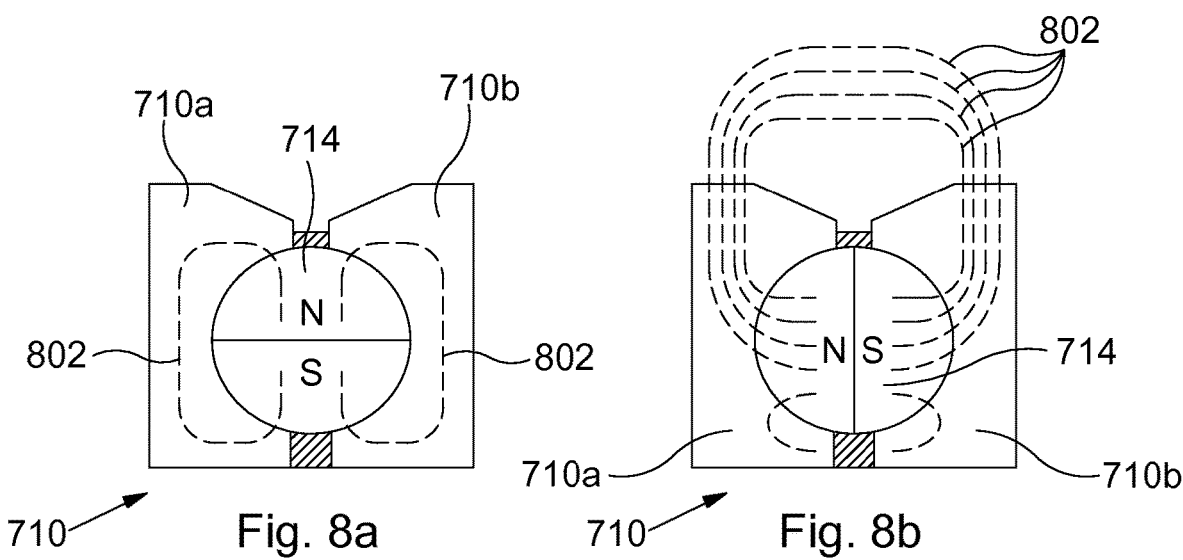
FIGS. 8a and 8b schematically show two modes of operation of a magnetic clamp.

A magnetic clamp 708 is shown in cross-section in FIGS. 8a and 8b. The magnetic clamp 708 has a generally square cross section with a V-shaped notch removed. The magnetic clamp 710 is oriented in the base member 706 with the notched side facing away from the panel 718. The magnetic flux guide 710 comprises two elongate portions comprising ferrous material, which are also referred to herein as a first ferrous portion 710a and a second ferrous portion 710b. The magnetic flux guide 710 also comprises a non-ferrous material arranged between the first and second ferrous portions 710a, 710b to prevent the first and second ferrous portions 710a, 710b from making contact with one another. The magnetic clamp 708 also comprises a hollow center section in which the magnetic element 714 is housed such that the magnetic element 714 can rotate 90 degrees between a first position and a second position. The magnetic element 714 is in contact with the magnetic flux guide 710 in order to provide an optimized clamping force. It will be appreciated that the clamping force may be reduced if the magnetic element 714 is at a distance from the magnetic flux guide 710 (i.e. not in direct contact with the magnetic flux guide 710).

The magnetic element 714 comprises a north pole N and a south pole S. When the magnetic element 714 is oriented such that the north pole N and south pole S each make contact with both ferrous portions 710a, 710b of the magnetic flux guide 710, the magnetic field 802 is entirely contained within the magnetic flux guide 710, as illustrated in FIG. 8a. As a result, the magnetic clamp is effectively "off" since there is no magnetic field acting outside of the magnetic flux guide 710. When the magnetic element 714 is rotated 90 degrees such that one pole of the magnetic element 714 makes contact only with the first ferrous portion 710a of the magnetic flux guide 710 and the other pole of the magnetic element 714 makes contact with only the second ferrous portion 710b of the magnetic flux guide 710, the magnetic flux guide 710 acts as part of the magnetic element 714 and the magnetic field 802 then extends outside of the magnetic flux guide 710, as illustrated in FIG. 8b. It will be appreciated that the magnetic element 714 need not be rotated by a full 90 degrees in order to cause the magnetic field 802 to become active outside of the magnetic flux guide 710. However, the strongest external magnetic field is generated when the north pole N and south pole S are each fully aligned with a respective one of the first and second ferrous portions 710a, 710b of the magnetic flux guide 710.

Figure 9A:
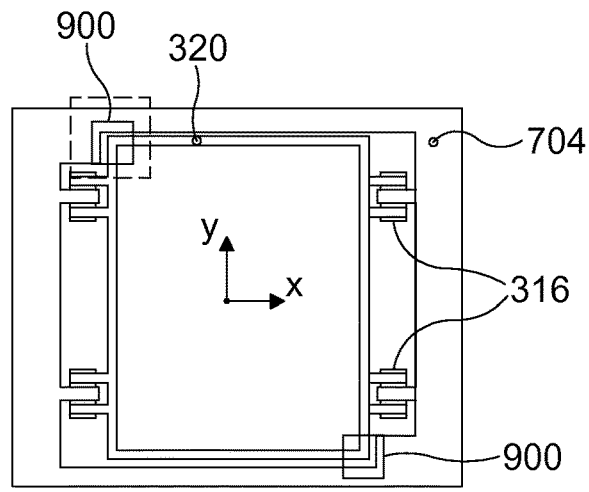
FIG. 9a schematically shows the alignment of a pellicle frame and fixture load carrier.

FIG. 9a shows a plan view of components of a partially assembled cassette, in particular the components depicted in FIG. 9a comprise a base member (not shown), an intermediate member 704, pellicle frame 320 and pellicle fixtures 316. The relative positioning of the base member, intermediate member 704 and pellicle frame 320 can be determined using a positioning system. The positioning system comprises at least one sensor for detecting a position of the components. The positioning sensor may be an optical sensor. In the embodiment shown in FIG. 9a, two sensors are provided. It will be appreciated, however, that more or fewer sensors may be provided. For example, one sensor may be provided; alternatively, four sensors may be provided. Each sensor has a detection area 900, which may also be referred to as a field of view, inside which the sensor is able to detect the presence of components. It will be appreciated that the term "field of view" is not intended to limit the sensor to an optical sensor. Indeed, the sensor may be an optical sensor, acoustic sensor, magnetic sensor or any other suitable sensor known to the skilled person. The sensors may be arranged on the opposite side of the base member to the intermediate member. In this case, the base member may be provided with one or more apertures through the base member (e.g. apertures 722 depicted in FIG. 7) in order to enable the sensors to detect the components arranged on the other side of the base member to the sensors. In the embodiment shown in FIG. 9*a*, the detection areas 900 are arranged to coincide with diagonally opposite corners of the pellicle frame 320 and intermediate member 704. By arranging the detection area 900 of a sensor to detect the corner of the frame 320, it is possible to use a single sensor to measure the alignment of the frame and/or intermediate member in two dimensions (indicated as x- and y-directions in FIG. 9*a*) since the relative positioning in a first dimension (e.g. the x-direction as indicated in FIG. 9*a*) and a second direction perpendicular to the first dimension (e.g. the y-direction as indicated in FIG. 9*a*) can be detected with reference to a side of the frame 320 extending in both the x-direction and the y-direction.

Figure 9B:
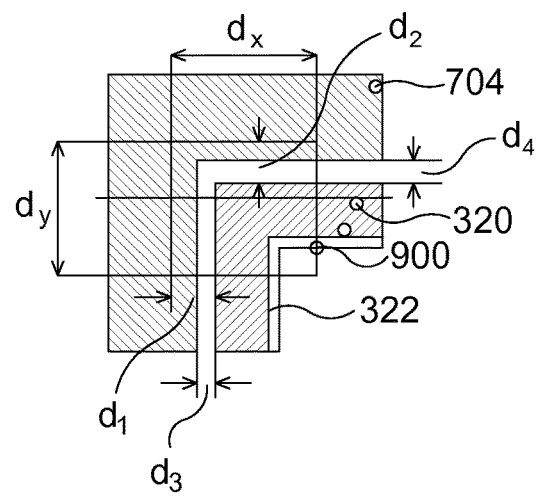

FIG. 9*b* shows a detail of FIG. 9*a* (indicated by the dashed box in FIG. 9*a*). The detection area 900 is illustrated as a square having dimensions dx by dy. However, it will be appreciated that this is merely schematic and that the detection area 900 may take any suitable shape. During pellicle cassette assembly, the frame 320 is first of all positioned in the detection area 900. In particular, a controller causes a positioning apparatus to move the frame such that it overlaps with the detection area 900. The controller may determine that the frame 320 is in the correct position when a certain amount of the detection area 900 is covered by the frame 320. Alternatively, the frame 320 may be determined to be in the correct position if a distance $d_1$ of a first edge of the frame from a first edge of the detection area 900 matches a first setpoint distance and if a distance $d_2$ of a second edge of the frame from a second edge (perpendicular to the first edge) of the detection frame 900 matches a second setpoint distance. In particular, if the determined distance $d_1$ and/or $d_2$ is found to differ from a respective first or second setpoint distance, the controller may be configured to cause the frame 320 to be moved until the setpoint distance(s) is/are reached. When the frame 320 is determined to be in the correct position, the controller causes the positioning apparatus to place the frame 320 on the base member.

Next, the pellicle film 322 is aligned with the positioned pellicle frame 320. A similar method may be used to position the film as used to position the frame, that is, the film 322 may be aligned with respect to the detection area 900. Alternatively, the film may be aligned based on the previously positioned frame 320. When correct alignment of the film is determined, the controller causes the positioning apparatus to place the film onto the frame.

Subsequently, the intermediate member 704 (that is, the fixture load carrier holding the pellicle fixtures) can be aligned with the frame 320. In this case, the previously positioned frame is used as a reference point. In particular, the sensor may detect a third distance $d_3$ of a first edge of the intermediate member from the first edge of frame 320 and a fourth distance $d_4$ of a second edge of the intermediate member 704 from the second edge of the frame 320 and the controller may compare the detected distances to respective setpoint values. If the determined distance $d_3$ and/or $d_4$ is found to differ from a respective third or fourth setpoint distance, the controller may be configured to cause the intermediate member 704 to be moved until the setpoint distance(s) is/are reached. When the intermediate member 704 is determined to be in the correct position, the controller causes the positioning apparatus to place the intermediate member 704 on the base member.

Figure 10:
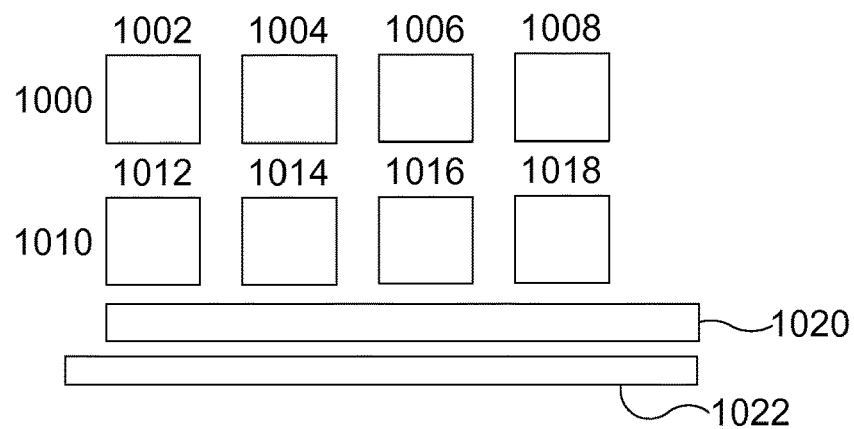
FIG. 10 schematically shows an apparatus for processing a pellicle cassette.

FIG. 10 schematically illustrates a system for assembling a pellicle using a cassette according to the embodiment illustrated in FIG. 7. The system comprises loading stations 1000 and processing stations 1010. In particular, the system may comprise a film loading station 1002, a frame loading station 1004, a fixture loading station 1006 and a park station 1008. The processing stations 1010 may include an unloading station 1012, a glue application station 1014, an unclamping station 1016 and an assembly station 1018. The system further comprises a handling apparatus 1020 for moving the components of the pellicle and/or of the pellicle cassette, and a positioning system 1022 for determining the correct positioning of the components relative to one another.

The respective pellicle components (film 322, frame 320 and fixtures 316) are loaded at the loading stations 1010. In particular, a film load carrier holding the film 322 is loaded at the film loading station 1002 and a frame load carrier holding the frame 320 is loaded at the frame loading station 1004. The fixtures 316 are arranged on a fixture load carrier, which will form the intermediate member 704 of the cassette 700, and the fixture load carrier with fixtures is loaded at the fixture loading station 1006. It will of course be appreciated that a single loading station 1000 may perform the function of the separately described film loading station 1002, frame loading station 1004 and fixture loading station 1006.

A base member 706 and pressure plate 702 are loaded into the park station 1008. The base member 706 is moved from the park station 1008 to the assembly station 1018 by the handling apparatus 1020, while the pressure plate 702 is stored at the park station 1008. Simultaneously or subsequently, the frame load carrier holding the 320 is moved to the glue application station 1014 by the handling apparatus 1020 in order for adhesive to be applied to the frame 320. The frame load carrier and frame 320 are then moved by the handling apparatus 1020 to the unloading station 1012, where the frame load carrier is unloaded from the system while the frame 320 remains in the unloading station 1012. The frame 320 is then moved to the assembly station 1018 by the handling apparatus 1022 to be arranged on the base member 706. The positioning system 1022 may be used to ensure accurate positioning of the frame 320 relative to the base member 706, for example as described with reference to FIGS. 9*a* and 9*b*.

The film load carrier and film 322 are moved to the unloading station 1012, where the film load carrier is unloaded from the system while the film 322 remains in the unloading station 1012. The film 322 is then moved to the assembly station 1018 to be arranged on the frame 320. A positioning system may be used to ensure accurate positioning of the film 322 relative to the frame 320, for example as described with reference to FIGS. 9*a* and 9*b*.

Next, the fixture load carrier with the fixtures 316 is moved to the assembly station 1018 and aligned with the frame 320 on the base member 706. Instead of being unloaded like the film and frame load carriers, the fixture load carrier remains in the assembly system and forms the intermediate member 704 of the cassette 700. The fixture load carrier is then placed on the base member 706.

Finally, the pressure plate 702 is retrieved from the park station 1008 and moved to the assembly station 1018. The pressure plate 702 is aligned relative to the film 322 and placed on the intermediate member 704 (that is, the fixture load carrier) to complete the cassette 700. The magnetic clamps 708 in the base member 706 are actuated to provide a clamping force to cause the pressure plate, intermediate member and base plate to be clamped together such that no relative movement between these components can be made.

The present invention may also be described by the following clauses:

Clause 1. An apparatus comprising:
- a first gripping member comprising a first magnetic element and moveable between a first position and a second position;
- a first biasing member configured to bias the first gripping member toward the first position; and
- a second magnetic element selectively operable in a first mode, in which the second magnetic element interacts with the first magnetic element to overcome the first biasing member and move the first gripping member to the second position, and a second mode, in which the second magnetic element does not overcome the first biasing member, such that the first gripping member rests in the first position.

Clause 2. The apparatus of clause 1, further comprising a second gripping member comprising a third magnetic element and moveable between a first position and a second position;
- a second biasing member configured to exert a biasing force on the second gripping member toward the first position; and
- a fourth magnetic element selectively operable in a first mode, in which the fourth magnetic element interacts with the third magnetic element to overcome the second biasing member and move the second gripping member to the second position, and a second mode, in which the fourth magnetic element does not overcome the second biasing member, such that the second gripping member rests in the first position.

Clause 3. The apparatus of any preceding clauses, wherein the apparatus is configured such that none of the surfaces of the first gripping member, first magnetic element, first biasing member and second magnetic element rub together during operation.

Clause 4. The apparatus of clause 2 or 3, wherein the apparatus is configured such that none of the surfaces of the second gripping member, third magnetic element, second biasing member and fourth magnetic element rub together during operation.

Clause 5. The apparatus of clause 2, wherein the first and second gripping members are configured to cooperate in a pincer motion.

Clause 6. The apparatus of any preceding clause, wherein the first gripping member comprises an arm.

Clause 7. The apparatus of any preceding clause, wherein one or both of the first and second magnetic elements comprises a permanent magnet, an electromagnet or an electropermanent magnet.

Clause 8. The apparatus of clause 2 or any clause dependent thereon, wherein one or both of the third and fourth magnetic elements comprises a permanent magnet, an electromagnet or an electropermanent magnet.

Clause 9. The apparatus of any preceding clause, wherein the first magnetic element and the second magnetic element are selectively operable to repel one another.

Clause 10. The apparatus of any preceding clause, wherein the first magnetic element and the second magnetic element are selectively operable to attract one another.

Clause 11. The apparatus of any preceding clause, wherein the poles of any of the magnetic elements are selectively reversible.

Clause 12. The apparatus of any preceding clause, wherein the first biasing member is a leaf spring.

Clause 13. The apparatus of any preceding clause, wherein the second magnetic element is provided with a housing, and wherein the first gripping member does not engage with the housing in the first position.

Clause 14. A pellicle assembly tool comprising the apparatus of any preceding clause, wherein the pellicle assembly tool is configured to use the apparatus to selectively grip a component.

Clause 15. A lithographic system comprising the pellicle assembly tool of clause 14.

Clause 16. A cassette for use in a pellicle assembly, comprising:
- a pressure plate comprising at least one gripping apparatus for gripping a pellicle;
- a base member for supporting a pellicle frame;
- a hood; and
- wherein the pressure plate is arranged so as to rest on the base member, the hood is arranged so as to cover the pressure plate and rest on the base member.

Clause 17. The cassette of clause 16, wherein the at least one gripping apparatus comprises a plurality of gripping apparatuses.

Clause 18. The cassette of clause 16 or 17, wherein the at least one gripping apparatus comprises at least one apparatus according to any of clauses 1 to 13.

Clause 19. The cassette of any one of clauses 16 to 18, further comprising a fastener configured to fasten the hood to the base member.

Clause 20. The cassette of clause 19, wherein the fastener comprises a clamp.

Clause 21. The cassette of any one of clauses 16 to 20, further comprising at least one sealing member disposed between the hood and the base member and/or between the base member and the pressure plate.

Clause 22. The cassette of any one of clauses 16 to 21, wherein the base member comprises a heater.

Clause 23. A pellicle cassette assembly apparatus, comprising a pressure plate lift and kinematic mount, wherein the kinematic mount is configured to move so as to be positioned below the pressure plate lift, and the pressure plate lift is configured to lower a pressure plate onto a base member positioned on the kinematic mount and subsequently release the pressure plate.

Clause 24. A computer-implemented method for curing a pellicle, comprising causing a pellicle cassette assembly tool to:
- retrieve a pellicle fixture from a fixture carrier;
- arrange a pellicle frame on a base member of a pellicle cassette;
- attach the pellicle fixture and a pellicle film to the pellicle frame using an adhesive;
- apply pressure to the pellicle fixture and the pellicle film using a pressure plate arranged to rest on the base member; and
- arrange a hood over the pressure plate such that it rests on the pressure plate and on the base member.

Clause 25. The method of clause 24, further comprising: affix the hood to the base member.

Clause 26. The method of clause 24 or 25, wherein an alignment between the pressure plate and the pellicle fixtures is established using a visual measurement system.

Clause 27. The method of any one of clause 24 to 21, wherein retrieving the pellicle fixture from the fixture carrier comprises gripping the fixture using an apparatus of any of clauses 1 to 13 such that the fixture can be lifted from the fixture carrier and moved to the pellicle frame.

Clause 28. A pellicle assembly tool comprising a pellicle cassette assembly tool configured to assemble a pellicle cassette and feed the cassette to a carousel configured to hold a plurality of pellicle cassettes for storage while the pellicle cassette assembly tool assembles further pellicle cassettes.

Clause 29. A pellicle cassette assembly tool configured to perform the method of any one of clauses 24 to 27.

Clause 30. A cassette for use in a pellicle assembly, comprising:
  a base member;
  an intermediate member for supporting a pellicle fixture at a predetermined position within the cassette;
  a pressure plate comprising at least one pressure finger configured to apply pressure to a pellicle film and/or the pellicle fixture;
  wherein in use the intermediate member is disposed between the base member and the pressure plate.

Clause 31. The cassette of clause 30, wherein the base plate comprises at least one clamp for clamping the intermediate member and/or the pressure plate.

Clause 32. The cassette of clause 31, wherein the at least one clamp comprises a magnetic element configured to provide a clamping magnetic field.

Clause 33. The cassette of clause 32, wherein the magnetic element is rotatable so as to vary a strength of the clamping magnetic field.

Clause 34. The cassette of clause 32 or 33, wherein the magnetic element comprises a plurality of permanent magnets.

Clause 35. The cassette of any of clauses 30 to 34, wherein the base plate comprises at least one aperture to enable detection of the intermediate member, the pellicle frame and/or the pellicle film by a positioning sensor of a positioning apparatus.

Clause 36. The cassette of any of clauses 30 to 35, wherein the at least one pressure finger comprises a leaf spring.

Clause 37. The cassette of any of clauses 30 to 36, further comprising a closure member.

Clause 38. A computer-implemented method of assembling a cassette for curing a pellicle, comprising causing a cassette assembly apparatus to:
  arrange a base member in a field of view of at least one imaging apparatus;
  align a pellicle frame with the field of view and positioning the pellicle frame on the base member; and
  align a pellicle film with the pellicle frame and positioning the pellicle film on the pellicle frame.

Clause 39. The method of clause 38, further comprising causing the cassette assembly apparatus to:
  align an intermediate member with the pellicle film and positioning the intermediate member on the base plate.

Clause 40. The method of clause 39, further comprising causing the cassette assembly apparatus to:
  clamp the intermediate member to the base plate.

Clause 41. The method of any of clauses 38 to 40, further comprising causing the cassette assembly apparatus to:
  determine a desired position of a pressure plate with reference to the position of the pellicle film;
  position the pressure plate at the desired position; and
  clamp the pressure plate to the base plate.

Clause 42. The method of clause 40 or 41, wherein clamping involves actuating a magnetic element to provide a clamping magnetic field.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions. Further, the apparatus may be used in connection with pellicles or membranes that are not intended for use in or in connection with lithographic tools or processes. Indeed, the apparatus described herein may be used in connection with pellicles intended for any purpose.

The term "EUV radiation" may be considered to encompass electromagnetic radiation having a wavelength within the range of 4-20 nm, for example within the range of 13-14 nm. EUV radiation may have a wavelength of less than 10 nm, such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus to grip an object, the apparatus comprising:
  a first gripping member comprising a first magnetic element and moveable between a first position of the first gripping member and a second position of the first gripping member;
  a first biasing member configured to bias the first gripping member toward the first position of the first gripping member; and
  a second magnetic element selectively operable in a first mode, in which the second magnetic element interacts with the first magnetic element to overcome the first biasing member and move the first gripping member to the second position of the first gripping member, and a second mode, in which the second magnetic element does not overcome the first biasing member such that the first gripping member rests in the first position of the first gripping member,
  wherein the second position corresponds to a gripping condition,
  wherein the first gripping member pivots in movement between the first and second positions, and
  wherein an imaginary line or arc of the movement passes both through a surface of the first gripping member arranged to contact the object and through the first magnetic element, the second magnetic element, or both the first and second magnetic elements.

2. The apparatus of claim 1, further comprising a second gripping member comprising a third magnetic element and moveable between a first position of the second gripping member and a second position of the second gripping member;
   a second biasing member configured to exert a biasing force on the second gripping member toward the first position of the second gripping member; and
   a fourth magnetic element selectively operable in a first mode, in which the fourth magnetic element interacts with the third magnetic element to overcome the second biasing member and move the second gripping member to the second position of the second gripping member, and a second mode, in which the fourth magnetic element does not overcome the second biasing member such that the second gripping member rests in the first position of the second gripping member.

3. The apparatus of claim 2, configured such that none of the surfaces of the second gripping member, third magnetic element, second biasing member and fourth magnetic element rub together during operation.

4. The apparatus of claim 2, wherein the first and second gripping members are configured to cooperate in a pincer motion.

5. The apparatus of claim 1, configured such that none of the surfaces of the first gripping member, first magnetic element, first biasing member and second magnetic element rub together during operation.

6. The apparatus of claim 1, wherein the first gripping member comprises an arm.

7. The apparatus of claim 1, wherein one or both of the first and second magnetic elements comprises a permanent magnet, an electromagnet or an electropermanent magnet.

8. The apparatus of claim 1, wherein the first magnetic element and the second magnetic element are selectively operable to repel one another.

9. The apparatus of claim 1, wherein the first magnetic element and the second magnetic element are selectively operable to attract one another.

10. The apparatus of claim 1, wherein the poles of any of the magnetic elements are selectively reversible.

11. The apparatus of claim 1, wherein the first biasing member is a leaf spring.

12. The apparatus of claim 1, wherein the second magnetic element has a housing, and wherein the first gripping member does not engage with the housing in the first position.

13. A pellicle assembly tool comprising the apparatus of claim 1, wherein the pellicle assembly tool is configured to use the apparatus to selectively grip a component.

14. An apparatus to grip an object, the apparatus comprising:
   a first gripping member comprising a first magnetic element and moveable between a first position of the first gripping member and a second position of the first gripping member;
   a first biasing member configured to bias the first gripping member toward the first position of the first gripping member; and
   a second magnetic element selectively operable in a first mode, in which the second magnetic element interacts with the first magnetic element to overcome the first biasing member and cause a movement of the first gripping member to the second position of the first gripping member, and a second mode, in which the second magnetic element does not overcome the first biasing member such that the first gripping member rests in the first position of the first gripping member,
   wherein none of the surfaces of the first gripping member, first magnetic element, first biasing member and second magnetic element rub against any surfaces during operation except for contact between the first gripping member and the object, and
   wherein an imaginary line or arc of the movement passes both through a surface of the first gripping member arranged to contact the object and through the first magnetic element, the second magnetic element, or both the first and second magnetic elements.

15. The apparatus of claim 14, wherein the second position corresponds to a gripping condition.

16. A pellicle assembly tool comprising the apparatus of claim 14, wherein the pellicle assembly tool is configured to use the apparatus to selectively grip a component.

17. An apparatus to grip an object, the apparatus comprising:
   a first gripping member comprising a first magnetic element and moveable between a first position of the first gripping member and a second position of the first gripping member;
   a first biasing member configured to bias the first gripping member toward the first position of the first gripping member, the first biasing member being a cantilevered leaf spring with a gripping element on a free portion of the cantilevered leaf spring; and
   a second magnetic element selectively operable in a first mode, in which the second magnetic element interacts with the first magnetic element to overcome the first biasing member and cause a movement of the first gripping member to the second position of the first gripping member, and a second mode, in which the second magnetic element does not overcome the first biasing member such that the first gripping member rests in the first position of the first gripping member,
   wherein an imaginary line or arc of the movement passes both through a surface of the gripping element arranged to contact the object and through the first magnetic element, the second magnetic element, or both the first and second magnetic elements.

18. The apparatus of claim 17, wherein the second position corresponds to a gripping condition.

19. The apparatus of claim 17, configured such that none of the surfaces of the first gripping member, first magnetic element, first biasing member and second magnetic element rub together during operation.

20. A pellicle assembly tool comprising the apparatus of claim 17, wherein the pellicle assembly tool is configured to use the apparatus to selectively grip a component.

* * * * *